United States Patent
Van Zyl

(10) Patent No.: US 10,074,518 B2
(45) Date of Patent: *Sep. 11, 2018

(54) APPARATUS FOR CONTROLLED OVERSHOOT IN A RF GENERATOR

(71) Applicant: Advanced Energy Industries, Inc., Fort Collins, CO (US)

(72) Inventor: Gideon Van Zyl, Fort Collins, CO (US)

(73) Assignee: Advanced Energy Industries, Inc., Fort Collins, CO (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/415,597

(22) Filed: Jan. 25, 2017

(65) Prior Publication Data

US 2017/0243723 A1 Aug. 24, 2017

Related U.S. Application Data

(63) Continuation of application No. 15/046,563, filed on Feb. 18, 2016, now Pat. No. 9,577,516.

(51) Int. Cl.
*H01J 7/44* (2006.01)
*H01J 37/32* (2006.01)
(Continued)

(52) U.S. Cl.
CPC .. *H01J 37/32146* (2013.01); *H01J 37/32183* (2013.01); *H02J 9/00* (2013.01);
(Continued)

(58) Field of Classification Search
CPC ............... H02M 7/538; H02M 7/5387; H02J 37/32082; H02J 37/321; H02J 37/32183;
(Continued)

(56) References Cited

U.S. PATENT DOCUMENTS 5,717,293 A 2/1998 Sellers
5,965,034 A 10/1999 Vinogradov et al.
(Continued)

FOREIGN PATENT DOCUMENTS

JP 2008178284 A 7/2008

OTHER PUBLICATIONS

TIPO, "Taiwan Office Action Re Application No. 103106442", dated Oct. 28, 2016, pp. 9 Published in: TW.
(Continued)

*Primary Examiner* — Vibol Tan
(74) *Attorney, Agent, or Firm* — Neugeboren O'Dowd PC

(57) ABSTRACT

A radio-frequency (RF) generator is provided that produces a controlled overshoot. One embodiment includes a RF power amplifier and a direct-current (DC) power supply that includes a primary DC power supply, an auxiliary DC power supply, a half-bridge circuit, and a control circuit. The half-bridge circuit, in a first switching state, electrically connects, in series, the auxiliary DC power supply with the primary DC power supply and, in a second switching state, electrically disconnects the auxiliary DC power supply from the primary DC power supply. The control circuit places the half-bridge circuit in the first switching state for a first period of time and places the half-bridge circuit in the second switching state for a second period of time to produce a controlled overshoot in the power produced by the RF generator throughout the first period of time.

20 Claims, 6 Drawing Sheets

(51) Int. Cl.
*H02M 3/155* (2006.01)
*H03F 3/20* (2006.01)
*H03F 3/19* (2006.01)
*H03F 3/189* (2006.01)
*H02J 9/00* (2006.01)

(52) U.S. Cl.
CPC ............... *H03F 3/189* (2013.01); *H03F 3/20* (2013.01); *H03F 2200/451* (2013.01)

(58) Field of Classification Search
CPC .... H05H 1/24; H05H 1/36; H03F 1/52; H03F 2200/441; H03F 3/2173; H03F 3/193; H03F 3/2171; G05F 3/08; H03K 17/08142
See application file for complete search history.

(56) References Cited

U.S. PATENT DOCUMENTS

| | | | |
|---|---|---|---|
| 6,469,919 B1 | 10/2002 | Bennett | |
| 6,703,080 B2 | 3/2004 | Reyzelman et al. | |
| 7,058,136 B1 * | 6/2006 | Hellberg | H03F 3/2178 370/225 |
| 7,214,934 B2 * | 5/2007 | Stevenson | H01J 37/321 250/286 |
| 7,259,622 B2 * | 8/2007 | Coleman | H01L 23/473 315/209 R |
| 7,512,422 B2 * | 3/2009 | Coleman | H01L 23/473 363/15 |
| 7,755,300 B2 * | 7/2010 | Kishinevsky | H01J 37/32082 315/209 R |
| 8,421,377 B2 | 4/2013 | Kirchmeier et al. | |
| 8,559,898 B2 | 10/2013 | Jones et al. | |
| 9,577,516 B1 * | 2/2017 | Van Zyl | H02M 3/155 |
| 2001/0054931 A1 | 12/2001 | Bar-David | |
| 2003/0058663 A1 | 3/2003 | Bennett | |
| 2003/0215373 A1 | 11/2003 | Reyzelman et al. | |
| 2003/0231062 A1 | 12/2003 | Bar-David et al. | |
| 2006/0241879 A1 | 10/2006 | Van Zyl | |
| 2009/0278512 A1 | 11/2009 | Karlicek et al. | |
| 2010/0168932 A1 | 7/2010 | Van Zyl | |
| 2010/0171427 A1 | 7/2010 | Kirchmeier et al. | |
| 2010/0174420 A1 | 7/2010 | Van Zyl | |
| 2010/0283395 A1 | 11/2010 | Van Zyl et al. | |
| 2011/0148303 A1 | 6/2011 | Van Zyl et al. | |
| 2012/0218042 A1 | 8/2012 | Mueller et al. | |
| 2012/0280618 A1 | 11/2012 | Utano et al. | |
| 2013/0002136 A1 | 1/2013 | Blackburn et al. | |

OTHER PUBLICATIONS

Sathiraju, Srinivas, "Office Action re U.S. Appl. No. 14/188,102", dated Apr. 12, 2016, pp. 46 Published in: US.

Gruber, Stephen S., "Response to Office Action Re U.S. Appl. No. 14/188,102", dated Jul. 29, 2016, pp. 14 Published in: US.

Tan, Vibol, "United States Office Action Re U.S. Appl. No. 15/046,563", dated Aug. 19, 2016, pp. 51 Published in: US.

Gruber, Stephen S., "Response to Office Action Re U.S. Appl. No. 15/046,563", dated Sep. 22, 2016, pp. 8, Published in: US.

Engelbrecht, et al., "A Wide-Band Low Noise L-Band Balanced Transistor Amplifier", Nov. 6, 1964, pp. 12 Publisher: Bell Telephone Laboratories, Inc., Published in: US.

Kurokawa, K., "Design Theory of Balanced Transistor Amplifiers", May 7, 1965, p. 24 Publisher: The Bell System Technical Journal, Published in: US.

Moon, Kihwan, "Internaitonal Preliminary Report on Patentability re Application No. PCT/US2014/018398", dated Sep. 11, 2015, pp. 8, Published in: CH.

Witrovic, Bayer, "International Search Report and Written Opinion re PCT/US2014/018398", dated Jun. 6, 2014, pp. 14, Published in: AU.

Mitrovic, Bayer, "International Search Report and Written Opinion Re Application No. PCT/US2017/015529", dated Apr. 12, 2017, pp. 9 Published in: AU.

* cited by examiner

APPARATUS FOR CONTROLLED OVERSHOOT IN A RF GENERATOR

CLAIM OF PRIORITY UNDER 35 U.S.C. § 120

The present Application for Patent is a Continuation of patent application Ser. No. 15/046,563 entitled "APPARATUS FOR CONTROLLED OVERSHOOT IN A RF GENERATOR" filed Feb. 18, 2016, pending, and assigned to the assignee hereof and hereby expressly incorporated by reference herein.

BACKGROUND

Field

The present disclosure relates generally to radio-frequency (RF) generators and, more specifically, to apparatuses and techniques for improving the performance of RF generators that employ balanced power amplifiers to supply power to a plasma processing chamber.

Background

Balanced amplifiers, as described for instance by K. Kurokawa, "Design theory of balanced transistor amplifiers," *Bell System Technical Journal,* Oct. 1965, are often used in power supply systems for plasma processing chambers. Unlike traditional single amplifiers, balanced amplifiers provide more desirable pulse shapes when using pulsed power to sustain a plasma. Balanced amplifiers also provide better plasma stability and further produce forward power independent of load impedance. In other words, for a given control input to the power amplifier, forward power does not change as a result of load impedance changes (e.g., due to changes in the plasma density or other plasma characteristics).

Yet, balanced amplifiers also create and amplify problems associated with traditional single amplifiers. For instance, when there is a load mismatch (e.g., during ignition or reignition of the plasma, where impedance changes drastically), power dissipation becomes unevenly distributed between the two amplifiers making up the balanced amplifier, which can damage the one dissipating more power. The traditional solution to this problem is to reduce the balanced amplifier's power profile (e.g., reduce load power at high load reflection coefficient magnitude) such that the amplifier dissipating more power is not damaged. In plasma ignition applications, this is a major drawback since plasma ignition normally requires an amplifier delivering substantial power into a non-matched load.

There is, therefore, a need in the art for an improved RF generator to supply power to a plasma processing chamber.

SUMMARY

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents, and alternative constructions that fall within the spirit and scope of the invention as expressed in the claims.

An aspect may be characterized as a radio-frequency (RF) generator that produces a controlled overshoot in its power output. The RF generator includes a RF power amplifier, a primary DC power supply, an auxiliary DC power supply, a half-bridge circuit, and a control circuit. The primary and auxiliary DC power supplies provide power to the RF power amplifier. The control circuit places the half-bridge circuit in a first switching state to connect the primary and auxiliary DC power supplies in series, producing a controlled overshoot in the output power of the RF generator throughout a first period of time. The control circuit places the half-bridge circuit in a second switching state that disconnects the auxiliary DC power supply from the primary DC power supply throughout a second period of time.

Another aspect may be characterized as the RF generator supplying power directly to a plasma load in a plasma processing chamber or indirectly via one or more matching networks. Related to this aspect is using the controlled overshoot in the output power of the RF generator for plasma ignition.

Another aspect may be characterized as a RF generator that includes a control circuit that, in turn, includes a non-transitory, tangible, machine-readable medium storing program instructions to perform a method. The method includes placing the half-bridge circuit in the first switching state for a first period of time to produce a controlled overshoot in the power produced by the RF generator throughout the first period of time and placing the half-bridge circuit in the second switching state for a second period of time.

In another aspect, the control circuit of the RF generator determines the duration of the controlled overshoot by observing a change in one or more properties of the load.

DETAILED DESCRIPTION

A radio-frequency (RF) generator, particularly one employing a balanced RF amplifier, can perform more effectively in applications such as igniting or reigniting a plasma in a plasma processing chamber if the power output by the RF generator includes a controlled overshoot. A "controlled overshoot" means the RF generator outputs, for a period of time, a predetermined level of power that exceeds the nominal level. In some embodiments, the controlled overshoot occurs at the leading edge of a power pulse produced by the RF generator.

One efficient and inexpensive way to produce such a controlled overshoot is to connect, in series, two DC power supplies to supply a controlled but higher-than-normal level of power to a RF amplifier for a desired period of time and, subsequently, to disconnect one of the DC power supplies from the RF amplifier to return the supplied DC power to the nominal level. In some embodiments, the RF amplifier is a balanced amplifier.

Figure 1:
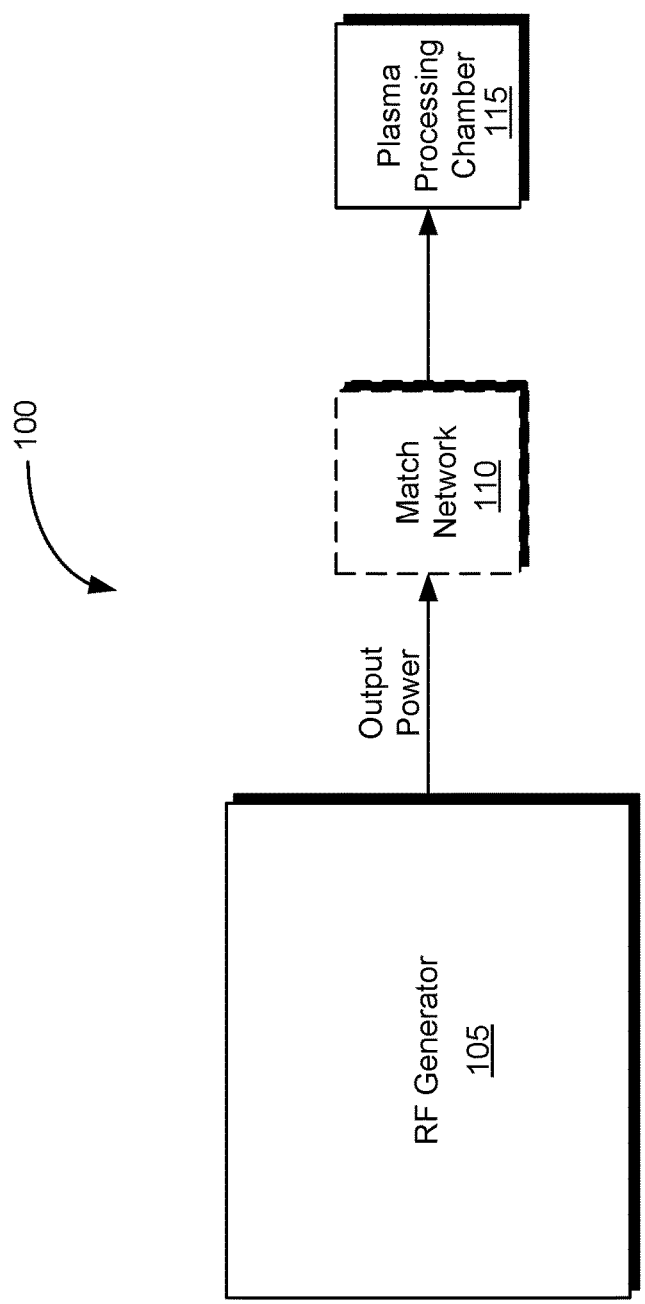
FIG. 1 shows a block diagram of a plasma processing system in accordance with an embodiment of this disclosure.

Referring now to the drawings, where like or similar elements are designated with identical reference numerals throughout the several views, and referring in particular to FIG. 1, it is a block diagram of a plasma processing system in accordance with an embodiment of this disclosure. In FIG. 1, plasma processing system 100 includes RF generator 105, which outputs power to a plasma load in plasma processing chamber 115 directly or indirectly via one or more matching networks 110.

Figure 2:
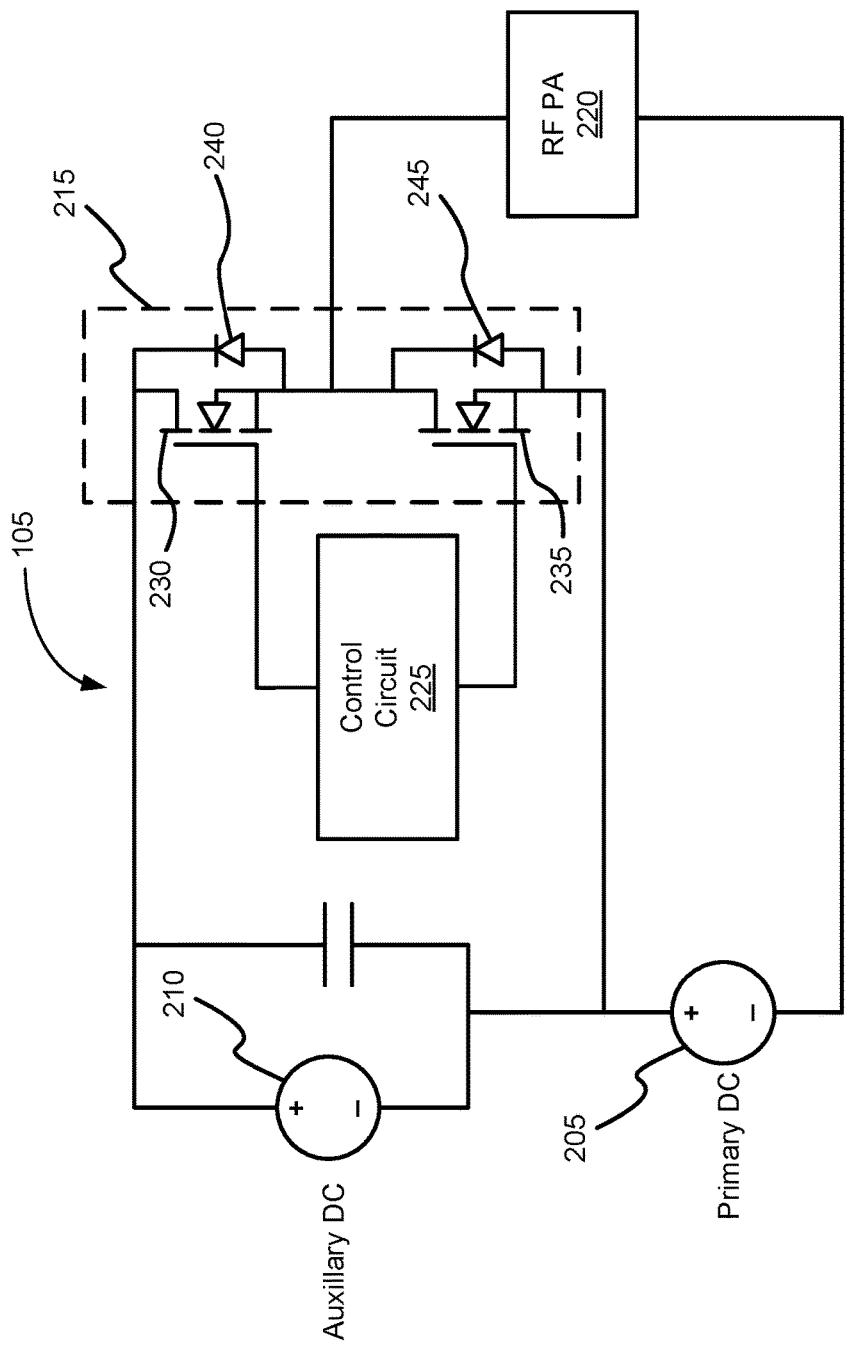
FIG. 2 is a schematic diagram of a radio-frequency (RF) generator in accordance with an embodiment of this disclosure.

FIG. 2 is a schematic diagram of the RF generator 105 in accordance with an embodiment of this disclosure. In FIG. 2, primary DC power supply 205 and auxiliary DC power supply 210 are electrically connected with RF power amplifier 220 via half-bridge circuit 215. In some embodiments, either or both of primary DC power supply 205 and auxiliary DC power supply 210 are variable. In an embodiment, the RF power amplifier may be realized by a balanced amplifier, which is known to those of ordinary skill in the art.

Half-bridge circuit 215 includes a pair of transistors 230 and 235 that act as switches and a pair of diodes 240 and 245. In one embodiment, transistors 230 and 235 are 50-V/50-A metal-oxide-semiconductor field-effect transistors (MOSFETs), and the diodes 240 and 245 are the intrinsic body diodes of the MOSFETs. In other embodiments, diodes 240 and 245 can be omitted—e.g., if the MOSFETs are replaced by GaN HEMT devices that have no intrinsic body diodes. When transistor 230 is switched to its "on" state and transistor 235 is switched to its "off" state, primary DC power supply 205 and auxiliary DC power supply 210 are electrically connected in series, supplying their combined power to RF power amplifier 220. This switching state will be referred to herein as the "first switching state" of half-bridge circuit 215. When transistor 230 is switched to its "off" state and transistor 235 is switched to its "on" state, auxiliary DC power supply 210 is disconnected from the circuit, and only primary DC power supply supplies power to RF power amplifier 220. This switching state will be referred to herein as the "second switching state" of half-bridge circuit 215.

A controlled overshoot can be produced in the power output by RF generator 105 by placing half-bridge circuit 215 in the first switching state for a first period of time corresponding to the desired duration of the overshoot. During a second period of time, the half-bridge circuit 215 is placed in the second switching state, returning the power output by RF generator 105 to a nominal level. In one embodiment, the controlled overshoot occurs at the leading edge of a power pulse, and the second period of time corresponding to nominal output power immediately follows the controlled overshoot (see FIG. 3 below).

In the embodiment shown in FIG. 2, control circuit 225 controls the switching states of half-bridge circuit 215 to produce the desired controlled overshoot. As shown in the figure, control circuit 225 is electrically connected with the gates of transistors 230 and 235 in order to switch the transistors "on" and "off" as needed. Control circuit 225 includes timing circuitry or logic (not shown in FIG. 2) to measure and control the duration of controlled overshoots and gate-driving circuitry (not shown in FIG. 2) for driving transistors 230 and 235. Depending on the particular embodiment, control circuit 225 can be implemented using discrete components; a microprocessor or microcontroller executing program instructions stored in a tangible, non-transitory machine-readable storage medium; a field-programmable gate array (FPGA); or other architecture.

Figure 3:
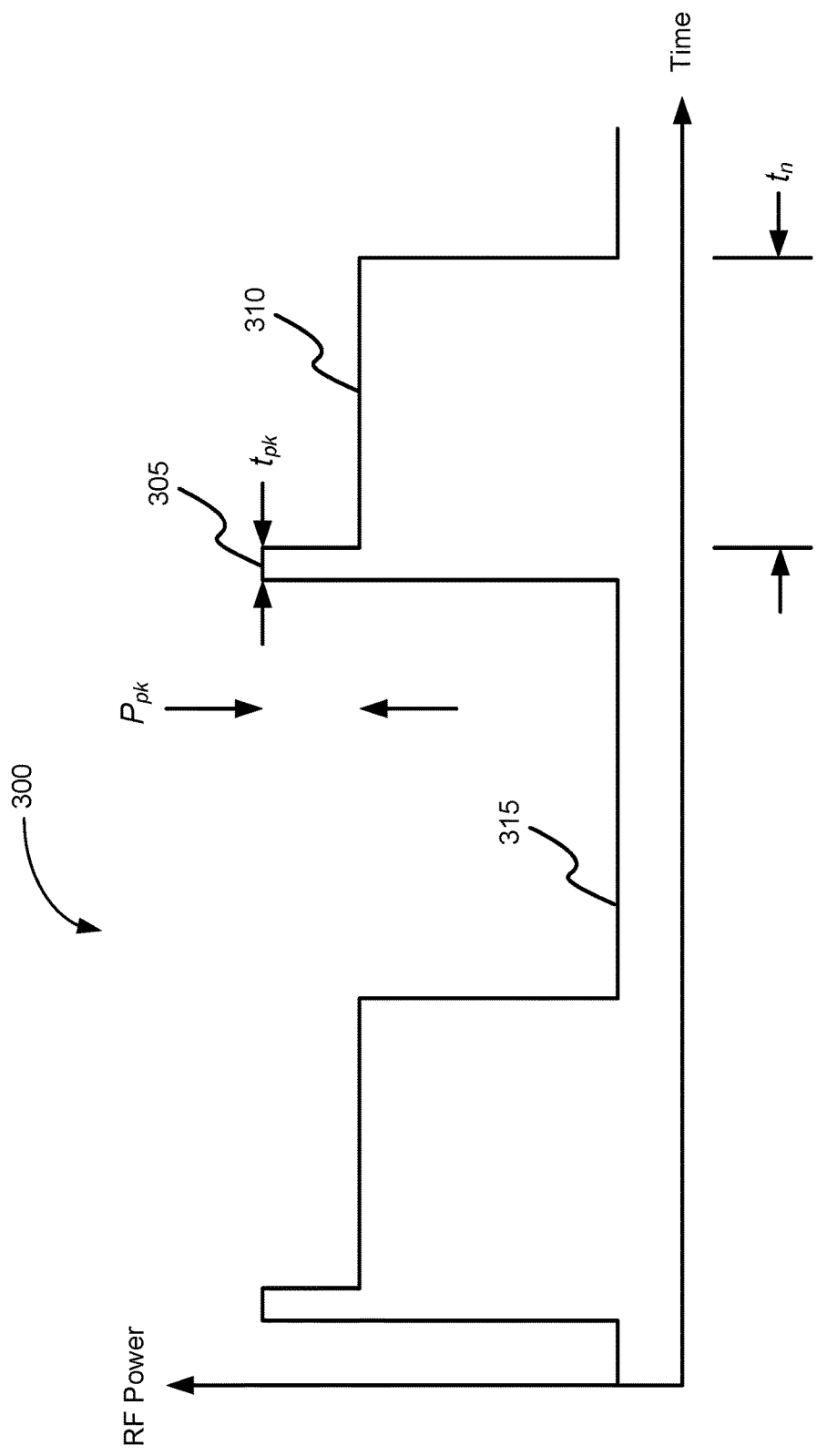
FIG. 3 is a power-waveform diagram illustrating the operation of a RF generator in accordance with an embodiment of this disclosure.

FIG. 3 is a power-waveform diagram 300 illustrating the operation of a RF generator 105 in accordance with an embodiment of this disclosure. In FIG. 3, a power pulse supplied to plasma processing chamber 115 includes a controlled overshoot 305 of duration $t_{pk}$. During the time period $t_{pk}$, RF generator 105 outputs power that exceeds a nominal power level 310 by $P_{pk}$ (the overshoot). The nominal power level 310 is maintained for a time period $t_n$ following controlled overshoot 305. The time period $t_{pk}$ thus corresponds to the "first period of time" (and the first switching state of half-bridge circuit 215) discussed above in connection with FIG. 2, and the time period $t_n$ corresponds to the "second period of time" (and the second switching state of half-bridge circuit 215) discussed above.

As shown in FIG. 3, the power output by RF generator 105 can, at various times, be different from the output power levels corresponding, respectively, to controlled overshoot 305 and nominal power level 310. For example, the portion of the power waveform labeled 315 represents a different power level from that of both controlled overshoot 305 and nominal power level 310. In other embodiments, only the two power levels corresponding, respectively, to overshoot 305 and nominal power level 310 are output by RF generator 305. In other words, in a power waveform corresponding to the output of RF generator 105, the time periods $t_{pk}$ (controlled overshoot 305) and $t_n$ (nominal power level 310) can be followed by zero, one, or more than one additional periods of time during which RF generator 105 produces an amount of power different from that produced during both $t_{pk}$ (controlled overshoot 305) and $t_n$ (nominal power level 310). Note also, that, in the embodiment depicted in FIG. 3, controlled overshoot 305 occurs at the leading edge of a power pulse. Further, FIG. 3 illustrates that, in some embodiments, the first, second, and additional periods of time can be made to repeat in a predetermined pattern to form a pulse train.

Figure 4:
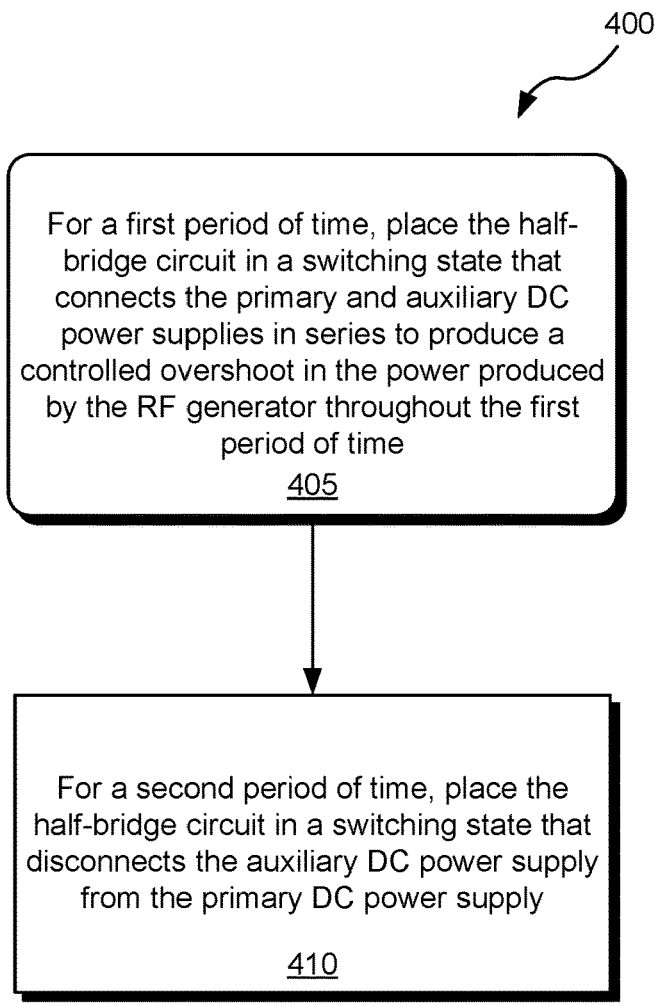
FIG. 4 is a flowchart of a method for controlling a RF generator in accordance with an embodiment of this disclosure.

FIG. 4 is a flowchart of a method 400 for controlling a RF generator 105 in accordance with an embodiment of this disclosure. In this embodiment, method 400 is performed by control circuit 225. At Block 405, control circuit 225 produces a controlled overshoot 305 in the output power of RF generator 105 by placing half-bridge circuit 215 in the first switching state (see discussion of FIG. 2 above) for time period $t_{pk}$ (see FIG. 3). At Block 410, control circuit 225 returns the output power level to nominal power level 310 for time period $t_n$ by placing half-bridge circuit 215 in the second switching state.

Figure 5:
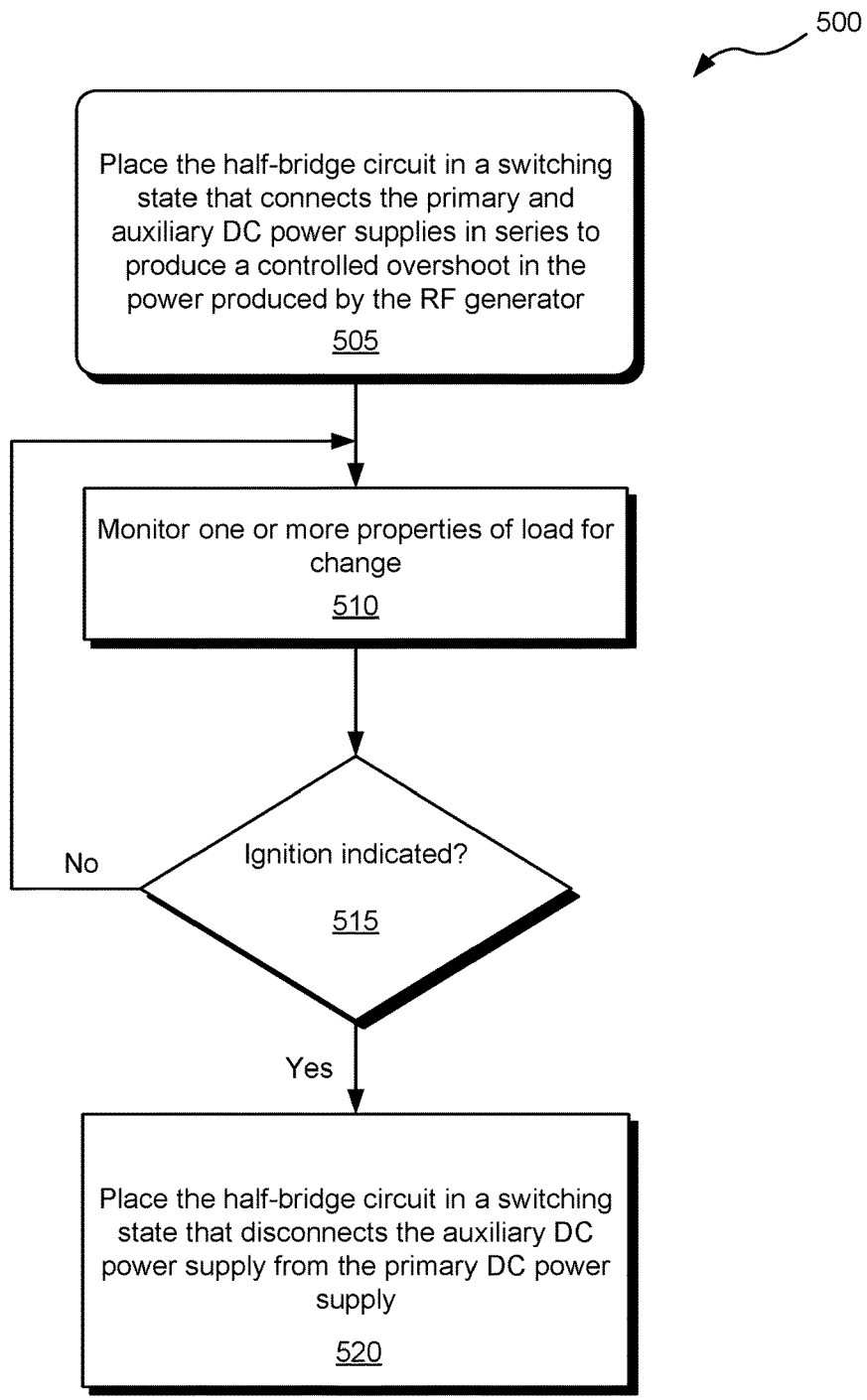
FIG. 5 is a flowchart of a method for controlling a RF generator in accordance with another embodiment of this disclosure.

FIG. 5 is a flowchart of a method 500 for controlling a RF generator 105 in accordance with another embodiment of this disclosure. At Block 505, control circuit 225 places half-bridge circuit 215 in the first switching state to produce a controlled overshoot 305 in the power output of RF generator 105. In this particular embodiment, instead of the controlled overshoot 305 lasting for a fixed time period $t_{pk}$, control circuit 225 monitors one or more properties of the load (e.g., the reflected power from a plasma load) to identify a change in the observed property or properties indicating that the controlled overshoot 305 should be terminated. This is reflected in Block 510. For example, in a plasma-processing-chamber embodiment such as that shown in FIG. 1, control circuit 225 can detect that ignition or reignition of the plasma has occurred by observing a rapid decrease in reflected power from the plasma load. When ignition or reignition is detected in this way, a controlled overshoot 305 can be ended. At Decision Block 515, control circuit 225 determines whether the monitored property or properties indicate that ignition of the plasma in plasma processing chamber 115 has occurred (i.e., that the looked-for change in properties has occurred that would indicate ignition or reignition). If not, control circuit 225 continues to monitor the load property or properties. If so, control circuit 225, at Block 520, ends the controlled overshoot 305 by placing half-bridge circuit 215 in the second switching state, returning the power output by RF generator 105 to nominal power level 310.

In one illustrative embodiment, a RF generator 105 employing a balanced RF power amplifier produces 6 kW in the second switching state when the primary DC power supply 205 supplies 160 V rail and 50 A current. In this embodiment, a 30-V auxiliary DC power supply 210 is sufficient to create a 40-percent increase in RF power during a controlled overshoot 305. If this additional power is needed 10 percent of the time, the power required from the 30-V auxiliary DC power supply 210 is only approximately 177 W. In this particular embodiment, the auxiliary DC power supply 210 requires 200 V isolation from ground (assuming the primary DC supply voltage can be increased from 160 to 200 V in some applications), and if the capacitor shunting the auxiliary DC power supply 210 is large enough, the auxiliary DC power supply 210 need supply only 6 Amps.

Figure 6:
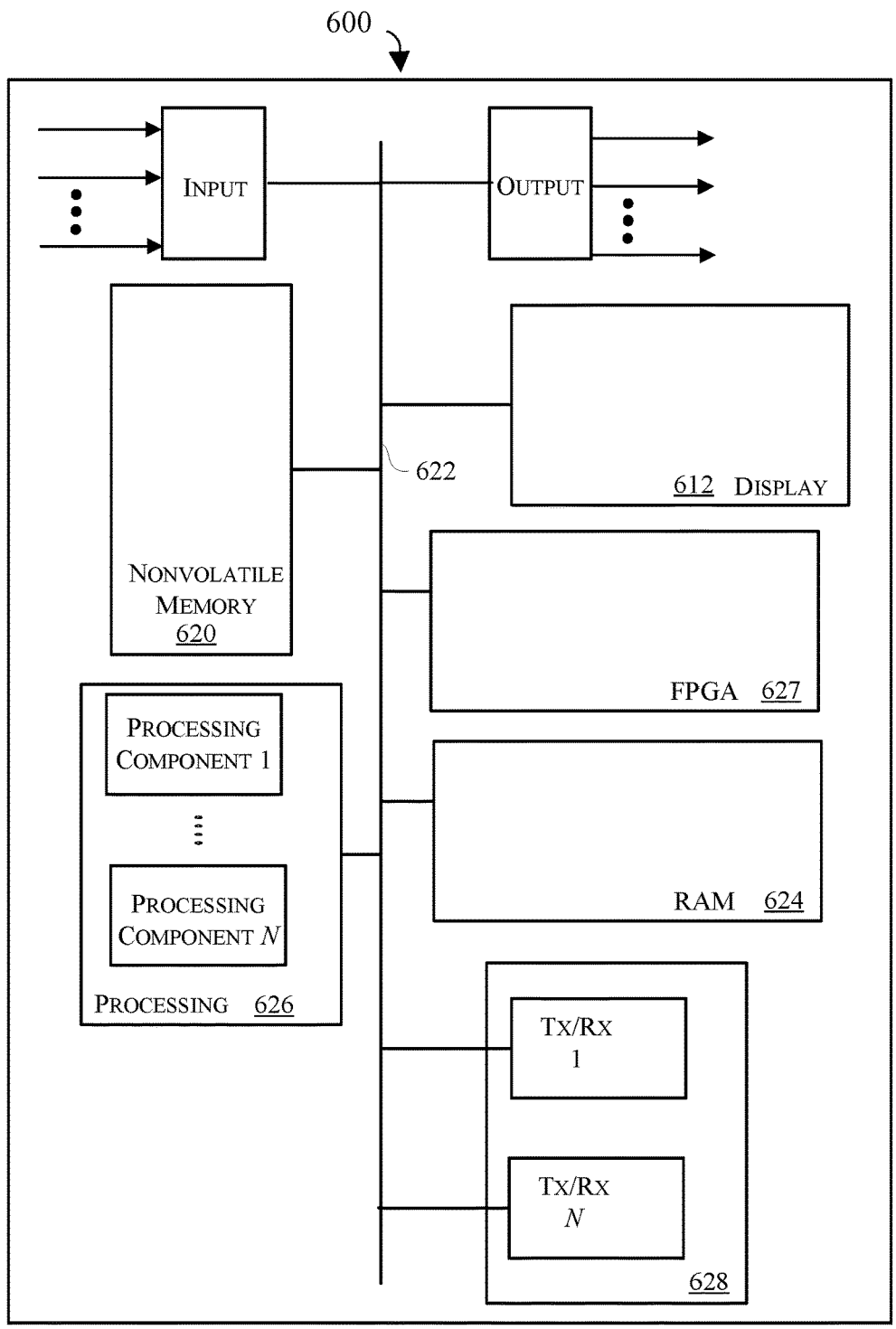
FIG. 6 is a block diagram depicting components that may be used to realize embodiments of the control circuit described herein.

The methods described in connection with the embodiments disclosed herein may be embodied directly in hardware, in processor executable instructions encoded in non-transitory machine readable medium, or in a combination of the two. Referring to FIG. 6 for example, shown is a block diagram depicting physical components that may be utilized to realize the control circuit 225 according to an exemplary embodiment. As shown, in this embodiment a display portion 612 and nonvolatile memory 620 are coupled to a bus 622 that is also coupled to random access memory ("RAM") 624, a processing portion (which includes N processing components) 626, a field programmable gate array (FPGA) 627, and a transceiver component 628 that includes N transceivers. Although the components depicted in FIG. 6 represent physical components, FIG. 6 is not intended to be a detailed hardware diagram; thus many of the components depicted in FIG. 6 may be realized by common constructs or distributed among additional physical components. Moreover, it is contemplated that other existing and yet-to-be developed physical components and architectures may be utilized to implement the functional components described with reference to FIG. 6.

This display portion 612 generally operates to provide a user interface for a user, and in several implementations, the display is realized by a touchscreen display. In general, the nonvolatile memory 620 is non-transitory memory that functions to store (e.g., persistently store) data and machine readable (e.g., processor executable) code (including executable code that is associated with effectuating the methods described herein). In some embodiments for example, the nonvolatile memory 620 includes bootloader code, operating system code, file system code, and non-transitory processor-executable code to facilitate the execution of the methods described with reference to FIGS. 4 and 5 described further herein.

In many implementations, the nonvolatile memory 620 is realized by flash memory (e.g., NAND or ONENAND memory), but it is contemplated that other memory types may be utilized as well. Although it may be possible to execute the code from the nonvolatile memory 620, the executable code in the nonvolatile memory is typically loaded into RAM 624 and executed by one or more of the N processing components in the processing portion 626.

In operation, the N processing components in connection with RAM 624 may generally operate to execute the instructions stored in nonvolatile memory 620 to realize the functionality of the control circuit 225. For example, non-transitory processor-executable instructions to effectuate the methods described with reference to FIGS. 4 and 5 may be persistently stored in nonvolatile memory 620 and executed by the N processing components in connection with RAM 624. As one of ordinarily skill in the art will appreciate, the processing portion 626 may include a video processor, digital signal processor (DSP), graphics processing unit (GPU), and other processing components.

In addition, or in the alternative, the field programmable gate array (FPGA) 627 may be configured to effectuate one or more aspects of the methodologies described herein (e.g., the methods described with reference to FIGS. 4 and 5). For example, non-transitory FPGA-configuration-instructions may be persistently stored in nonvolatile memory 620 and accessed by the FPGA 627 (e.g., during boot up) to configure the FPGA 627 to effectuate the function of the control circuit 225.

The input component may operate to receive signals (e.g., at the output of the RF PA 220 via a sensor) that are indicative of one or more aspects of the output power (e.g., the power-waveform depicted in FIG. 3). The signals received at the input component may include, for example, voltage, current, forward power, reflected power and plasma load impedance. The output component generally operates to provide one or more analog or digital signals to effectuate an operational aspect of the generator. For example, the output portion may gate drive signals to the transistors 230 and 235 to open and close conduction paths formed by the transistors 230 and 235.

The depicted transceiver component 628 includes N transceiver chains, which may be used for communicating with external devices via wireless or wireline networks. Each of the N transceiver chains may represent a transceiver associated with a particular communication scheme (e.g., WiFi, Ethernet, Profibus, etc.).

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:
1. A radio-frequency (RF) generator, comprising:
   a RF power amplifier; and
   a direct-current (DC) power supply electrically connected with the RF power amplifier to supply electrical power to the RF power amplifier, the DC power supply including:
      a primary DC power supply;
      an auxiliary DC power supply;
      a half-bridge circuit that, in a first switching state, applies power to the RF power amplifier by electrically connecting, in series, the auxiliary DC power supply with the primary DC power supply and that, in a second switching state, electrically disconnects the auxiliary DC power supply from the primary DC power supply while applying power from the primary DC power supply to the RF power amplifier; and a control circuit that places the half-bridge circuit in the first switching state for a first period and that places the half-bridge circuit in the second switching state for a second period to produce a controlled overshoot in the power produced by the RF generator throughout the first period, wherein the first period begins at a leading edge of a power pulse produced by the RF generator and the second period immediately follows the first period.

2. The RF generator of claim 1, wherein the RF power amplifier is a balanced RF power amplifier.

3. The RF generator of claim 1, wherein at least one of the primary DC power supply and the auxiliary DC power supply is variable.

4. The RF generator of claim 1, wherein the RF generator directly or indirectly supplies power to a plasma load through one or more matching networks.

5. The RF generator of claim 1, wherein the controlled overshoot in the power produced by the RF generator is used for plasma ignition.

6. The RF generator of claim 1, wherein the first and second periods are followed by zero, one, or a plurality of additional periods during which the RF generator produces a different amount of power than during the first and second periods.

7. The RF generator of claim 1, wherein the first, second, and any additional periods repeat in a predetermined pattern to form a pulse train.

8. The RF generator of claim 1, wherein the control circuit is configured to determine the first period by observing a change in the properties of a load connected with an output of the RF generator.

9. A radio-frequency (RF) generator, comprising:
a RF power amplifier; and
a direct-current (DC) power supply electrically connected with the RF power amplifier to supply electrical power to the RF power amplifier, the DC power supply including:
a primary DC power supply;
an auxiliary DC power supply;
a half-bridge circuit that, in a first switching state, electrically connects, in series, the auxiliary DC power supply with the primary DC power supply and that, in a second switching state, electrically disconnects the auxiliary DC power supply from the primary DC power supply; and
a control circuit that includes a non-transitory, tangible, machine-readable medium encoded with instructions to perform a method, the method including:
placing the half-bridge circuit in the first switching state for a first period, beginning at a leading edge of a power pulse produced by the RF power amplifier, to produce, for plasma ignition, a controlled overshoot in the power produced by the RF generator throughout the first period; and
placing the half-bridge circuit in the second switching state for a second period, the second period immediately following the first period.

10. The RF generator of claim 9, wherein the first and second periods are followed by zero, one, or a plurality of additional periods during which the RF generator produces a different amount of power than during the first and second periods.

11. The RF generator of claim 9, wherein the first, second, and any additional periods repeat in a predetermined pattern to form a pulse train.

12. The RF generator of claim 9, wherein the first period is fixed.

13. The RF generator of claim 9, wherein the method further includes:
determining the first period by observing a change in the properties of a load connected with an output of the RF generator.

14. The RF generator of claim 9, wherein the RF generator directly or indirectly supplies power to a plasma load through one or more matching networks and the controlled overshoot in the power produced by the RF generator is used for plasma ignition.

15. A radio-frequency (RF) generator, comprising:
means for amplifying RF power;
means for supplying direct-current (DC) power to the means for amplifying RF power, the means for supplying DC power including primary means for supplying DC power and auxiliary means for supplying DC power;
means for switching that, in a first switching state, electrically connects, in series, the auxiliary means for supplying DC power with the primary means for supplying DC power and that, in a second switching state, electrically disconnects the auxiliary means for supplying DC power from the primary means for supplying DC power; and
means for controlling the means for switching that places the means for switching in the first switching state for a first period, beginning at a leading edge of a power pulse produced by the means for amplifying RF power, and that places the means for switching in the second switching state for a second period, immediately following the first period, to produce, for plasma ignition, a controlled overshoot in the power produced by the RF generator throughout the first period.

16. The RF generator of claim 15, wherein the means for controlling the means for switching is configured to cause the first and second periods to be followed by zero, one, or a plurality of additional periods during which the RF generator produces a different amount of power than during the first and second periods.

17. The RF generator of claim 15, wherein the means for controlling the means for switching is configured to cause the first, second, and additional periods to repeat in a predetermined pattern to form a pulse train.

18. The RF generator of claim 15, wherein the first period is fixed.

19. The RF generator of claim 15, wherein the means for controlling the means for switching is configured to determine the first period by observing a change in the properties of a load connected to an output of the RF generator.

20. The RF generator of claim 15, wherein the RF generator directly or indirectly supplies power to a plasma load through one or more matching networks.

* * * * *